United States Patent [19]
Yew et al.

[11] Patent Number: 6,020,258
[45] Date of Patent: Feb. 1, 2000

[54] METHOD FOR UNLANDED VIA ETCHING USING ETCH STOP

[76] Inventors: Tri-Rung Yew, 7F, No. 512, Sec. 3, Pei-Hsing Rd., Chu-Tung, Chen, Hsinchu Hsien; Water Lur, 3F, No. 513, Fuhsing N. Rd.; Shih-Wei Sun, 5F, No. 33, Alley 26, Lane 300, Jen-Ai Rd., Sec. 4, both of Taipei City, all of Taiwan

[21] Appl. No.: 08/982,266

[22] Filed: Dec. 1, 1997

Related U.S. Application Data

[60] Provisional application No. 60/051,857, Jul. 7, 1997.

[51] Int. Cl.⁷ .................................................. H01L 21/44
[52] U.S. Cl. .......................... 438/634; 438/622; 438/629; 438/740; 438/970
[58] Field of Search .................................. 438/622, 629, 438/634, 740, 970

[56] References Cited

U.S. PATENT DOCUMENTS

| | | | |
|---|---|---|---|
| 4,630,357 | 12/1986 | Rogers et al. | 29/590 |
| 5,451,543 | 9/1995 | Woo et al. | 437/195 |
| 5,827,776 | 10/1998 | Bandyopadhyay et al. | 438/624 |
| 5,882,999 | 3/1999 | Anderson et al. | 438/629 |

*Primary Examiner*—Chandra Chaudhari
*Assistant Examiner*—Lisa A. Kilday
*Attorney, Agent, or Firm*—Rabin & Champagne, P.C.

[57] ABSTRACT

A multilevel interconnect structure is formed in a manner that reduces the problems associated with the formation and subsequent filling of unlanded vias. A first level wiring line is provided on the surface of an interlayer dielectric. The upper surface and sidewalls of the first level wiring line are covered with an etch stop material that is different from the intermetal dielectric used to separate the first level of wiring line from upper levels of wiring lines. The intermetal dielectric layer is deposited over the first level wiring line and a via is etched through the intermetal dielectric to expose the etch stop material above the wiring line, with the via etch stopping on the etch stop material. Etch stop material is removed to expose a portion of the upper surface of the wiring line and a metal plug is formed within the via and then an upper level wiring line is formed in contact with the metal plug.

13 Claims, 3 Drawing Sheets

METHOD FOR UNLANDED VIA ETCHING USING ETCH STOP

This application claims priority from provisional application Ser. No. 60/051,857, filed Jul. 7, 1997.

BACKGROUND OF THE INVENTION

1. Field of the Invention

The present invention relates to the formation of multilevel interconnect structures of the type that are found in high density integrated circuit deices.

2. Description of the Related Art

High density integrated circuits are made up of devices, such as field effect transistors (FETs) and bipolar devices formed in and on a semiconductor substrate, and the multilevel interconnect structures that are used to form connections to and between the various devices in and on the semiconductor substrate. Many high density integrated circuits include closely spaced arrays of devices that are accessed by and connected to one or more arrays of parallel wiring lines formed above the substrate and the devices. Arrays of closely spaced wiring lines are familiar features of integrated circuit memories such as nonvolatile memories like ROM, EEPROM and flash EEPROM, dynamic random access memories (DRAM) and static random access memories because of the regularity of these circuits. Because of the requirements of routing interconnects efficiently while using a few layers of interconnects as is possible, parallel arrays of wiring lines are also featured in digital signal processors, microprocessors and even more random sorts of logic circuits.

For all sorts of these various applications, how wide wiring lines are made and how closely the wiring lines can be spaced are significant considerations in determining the size and cost of the final integrated circuit. Simply put, reduced design rules tend to produce smaller and less expensive integrated circuits. Additionally, reduced design rules affect how connections are made to wiring lines and how different levels of wiring lines can be interconnected. For example, in many multilevel interconnect designs, it is conventional to provide a wider portion of a wiring line in those regions where a vertically extending interconnect is to be formed. Thus, if a vertical interconnect is to be formed between the end of a first level wiring line and a second level wiring line separated by an intermetal dielectric layer, a square or circular pad might be provided at the end of the first level wiring line that is wider than the rest of the first level wiring line. After the first level wiring line is formed, the intermetal dielectric layer is provided and then a via is formed through the intermetal dielectric layer to expose within the via a portion of the pad on the end of the first level wiring line. Metal is provided to fill the via and then a wiring line is formed over the metal plug within the via to complete the connection. Providing such a "dog bone" shaped structure for the first level wiring line increases the alignment and lithography process margins for the processes used in forming the interconnect structure. The cost of providing such a "dog bone" shaped structure is that the wiring lines cannot be spaced as closely together due to the increased width of the wiring line associated with the pad. For aggressive device designs, it is undesirable to provide an oversized portion of a wiring line to facilitate the easier formation of vertically extending metal interconnects.

On the other hand, when wiring lines are made to have a width near or at the resolution limit of the particular lithography process being used in forming the device, it is likely inevitable that unlanded vias will be formed when the vias are formed without an enlarged contact pad. Unlanded vias are ones that extend over the edge of a metal wiring line or other conductor to which the desired connection is to be made. Such unlanded vias are in many ways inevitable because the vias are formed having a width that is approximately the same as the wiring lines that are being contacted so that essentially perfect alignment is necessary to align the via to the wiring line if an unlanded via is to be avoided. Any misalignment of the via results in a portion of the via being positioned over the edge of the wiring line and, hence, unlanded. Aspects of conventional via formation problems are illustrated in FIGS. 1–3. FIG. 1 illustrates one extreme of the unlanded via problem. An interlayer dielectric 20 covers a substrate 10 and has a first level wiring line 22 on its surface, with both the first level wiring line 22 and the interlayer dielectric 20 covered by a layer of an intermetal dielectric 24. Typically, the intermetal dielectric layer 24 is an oxide of silicon. The FIG. 1 structure is formed by depositing a layer of interlayer dielectric 20 over the semiconductor substrate 10 in which devices (not shown) including, for example, field effect transistors are provided. Metal or other wiring lines 22 are formed on the surface of the interlayer dielectric 20 by blanket depositing a layer of metal and patterning the metal into wiring lines using conventional photolithography. The intermetal dielectric layer 24 is then deposited, for example using chemical vapor deposition from a TEOS source gas, and vias 26 are formed through the intermetal dielectric 24 where interconnects are to be formed between the first level wiring line 22 and the wiring lines 28 or other conductors formed on the surface of the intermetal dielectric 24.

Vias for the vertical interconnect structure are typically formed through the intermetal dielectric layer 24 in a fixed time etching process, often using a fluorine based etchant which readily etches the oxide intermetal dielectric 24 and which does not etch metals. The via etch process typically is designed to include a sufficient level of overetch to ensure that the surface of the first level wiring line is cleared in the via etch process. It is generally impractical to rely on optical or other endpoint detection mechanisms for determining the endpoint of the via etch process because such endpoint detection processes are difficult. For example, if a fluorine based etchant is used to etch through an oxide to an underlying aluminum layer, the etch is unlikely to produce a good endpoint detection signature because of the very low volatility of aluminum fluorides, which are the expected endproduct of the via etching operation. In addition, the signal levels for typical optical endpoint detection system are low, since the endpoint detection signal must be sensed remotely from a chamber that includes a plasma source which acts as a bright, broadband light source. Consequently, it may be difficult to detect etching endpoints with satisfactory reliability. By necessity then, via etching is often a fixed time operation which incorporates a predefined level of overetching by design. Thus, for any misalignment in the via etching process, the unlanded portion 30 of the via will be etched alongside the wiring line 22 and possibly into the interlayer dielectric 20 on which the wiring line 22 is formed. While the deep unlanded portion 30 of the via 26 shown in FIG. 1 might arise through poor process design, it might occur simply from variations in the etching process, variations in the thickness of the wiring line 22 or the intermetal dielectric 24, or variations in the composition or density of the interlayer dielectric 20. Because it might cause a short of the wiring line 22 to a structure formed below the wiring line, the deep unlanded portion 30 of the via 26 is undesirable.

FIG. 2 illustrates a problem that represents a different extreme of the conventional via etch process. The structure of FIG. 2 and the method of making the FIG. 2 structure are largely the same as those illustrated in FIG. 1, except that the via etch process has stopped short of reaching the surface of the wiring line 22 so that a metal plug formed within the via 26 will not connect the first level wiring line 22 to the second level wiring line 28. As was the case with the FIG. 1 structure, it is possible that the FIG. 2 structure might arise from bad design, such as by not allowing a sufficient overetch margin for the via etch process. On the other hand, it is possible that such a failure could arise while operating within the tolerances of all of the processes involved in making the device of FIG. 2. In fact, it is conceivable that both the FIG. 1 and the FIG. 2 types of errors could arise on a single wafer. As a practical matter, failures like those illustrated in FIGS. 1 and 2 which arise when processes are completed within designed ranges are more detrimental to production efficiency and are less easily remedied than are failures which occur because of out of range process steps.

FIG. 3 shows another type of failure mechanism in a vertical interconnect structure that can arise even when all of the interconnect formation processing steps are performed within their optimal ranges. The FIG. 3 failure mechanism arises simply because the via is unlanded. As illustrated, a narrow unlanded portion or "notch" 32 of the via extends partially along the side of the wiring line 22 by an amount that may reflect the extent of overetch provided by design in the interconnect formation process. Thus, the notch 32 of the via will arise frequently in practical manufacturing processes operated in their designed manner. The notch 32 may trap impurities that cannot normally be cleaned by etching or solvent cleans. These impurities can exit the notch 32 during subsequent processing steps in a manner that can contaminate a subsequently deposited barrier layer and can make it difficult to fill the via with a metal plug. As such, the absence of an enlarged landing pad on the first level wiring line can lead to poor quality interconnect structures or otherwise reduce yields even when the process steps are performed with a high level of process control. It is thus desirable to develop a more reliable method for forming multilevel interconnect structures.

SUMMARY OF THE PREFERRED EMBODIMENTS

To this end, preferred embodiments of the present invention provide a method of making a multilevel interconnect structure that provides an etch stop for the via etch process and which reduces the likelihood that notches can form alongside a wiring line in an unlanded via etch process.

According to an aspect of the present invention, an integrated circuit is formed on a substrate which is covered by a layer of insulating material. A first level wiring line is provided over the layer of insulating material, where the first level wiring line has an upper surface and sidewalls. The upper surface and the sidewalls of the first level wiring line are covered with an etch stop material. A dielectric layer is provided over the first level wiring line. A via is formed through the dielectric layer to expose the etch stop material within the via. Etch stop material is removed to expose the first level wiring line and a conductive plug is provided within the via. A second level wiring line is provided in contact with the conductive plug.

According to another aspect of the invention, an integrated circuit is formed on a substrate. A layer of insulating material is deposited over the substrate and a wiring line is provided on a surface of the layer of insulating material, the wiring line having sidewalls and an upper surface. A layer of etch stop material is deposited over the wiring line and over the surface of the layer of insulating material and a layer of dielectric material is deposited over the layer of etch stop material, the dielectric material having a different composition than the etch stop material. A via is etched through the layer of dielectric material over the wiring line, with at least a latter portion of the etching step being performed with an etchant that etches the dielectric material at a sufficiently greater rate than the etchant etches the etch stop material for the etch stop material to function as a stop for the etching process. A conductor is then provided within the via.

DETAILED DESCRIPTION OF THE PRESENT INVENTION

Preferred embodiments of the present invention provide a multilevel interconnect structure in a manner that reduces the problems associated with the formation and subsequent filling of unlanded vias. A first level wiring line is provided on the surface of an interlayer dielectric and the upper surface and sidewalls of the first level wiring line are covered with an etch stop material. An intermetal dielectric layer is deposited over the first level wiring line. Preferably, the etch stop material is different from the intermetal dielectric. A via is etched through the intermetal dielectric to expose the etch stop material above the wiring line, with the via etch stopping on the etch stop material. Etch stop material is removed to expose a portion of the upper surface of the wiring line. A metal plug is formed within the via and then an upper level wiring line is formed in contact with the metal plug. The etch stop layer provides a stopping point for the via etch and provides an enlarged area over which the via etch process can be performed without the via becoming unlanded. By providing a stopping point for the via etch, there is greater latitude for providing an overetch margin to ensure that the via etch reaches the surface of the wiring line. In addition, providing a layer of an etch stop material on the sidewalls of the wiring line enlarges the target area for the via etch process and reduces the likelihood that an undesirable sort of notch is formed alongside the wiring line during the via etch. These and other aspects of the present invention are now described in greater detail with reference to the figures.

Figure 4:
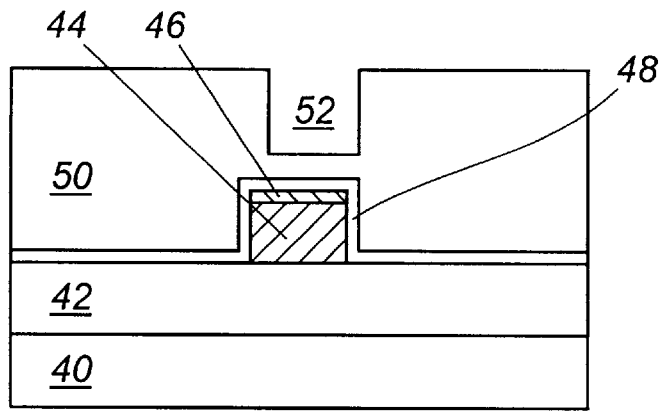
FIGS. 4–7 illustrate aspects of processes for forming an interconnect structure in accordance with preferred embodiments of the present invention.

Referring first to FIG. 4, an integrated circuit is formed in part by providing transistors, other sorts of devices, and interconnections on a substrate 40 (transistors, etc., not shown). These devices are contacted and interconnected using a multilevel interconnect structure formed in accordance with the present invention, which is an important component of the integrated circuit. The substrate 40 and the devices and structures formed in and on the substrate are covered by a layer of an interlayer dielectric 42. The interlayer dielectric might include a doped or undoped oxide layer deposited by chemical vapor deposition (CVD) or might include a spin on glass or other of the known insulators know for use in the art of integrated circuits. It is often desirable to planarize the interlayer dielectric layer 42 either through a reflow process, a sacrificial spin on glass and etch back process or by application of a chemical mechanical polishing (CMP) process.

A first level wiring line 44 is formed on the surface of the interlayer dielectric 42 by blanket depositing over the interlayer dielectric and patterning using conventional photolithography a layer of aluminum or a layer of another suitable conductor or metal. Alternately, the first level wiring line might be formed from a combination of different layers of different conductors. The first level wiring line 44 may be connected to devices formed in and on the substrate 40 at a remote location (not shown), or the first level wiring line 44 may be connected to such devices through intermediate conductors. A common implementation of a first level wiring line includes a layer of aluminum 44 covered by a layer of titanium nitride 46. The titanium nitride layer 46 helps to stabilize the aluminum wiring line to electromigration stresses and assists in the formation of contacts to the aluminum wiring line by acting as a barrier to diffusion into and from the aluminum layer and improves adhesion of other conductors to the aluminum layer 44.

In accordance with a particularly preferred aspect of the present invention, the wiring line 44 is then covered by a layer of an etch stop material 48. The etch stop material is chosen according to the particular intermetal dielectric material deposited over the first level wiring line. Thus, it is preferred that the etch stop material be unetched or only slowly etched by the particular etch chemistry preferred for etching the intermetal dielectric material. Frequently, the intermetal dielectric is selected to be a silicon oxide so that the etch stop material 48 can be silicon nitride. It is preferred that the etch stop layer be deposited in a relatively low temperature process that is compatible with the presence of aluminum or other wiring lines that are in many ways incompatible with high temperature processing. As such, the silicon nitride, oxynitride or other etch stop layer may be deposited using high density plasma chemical vapor deposition (HDPCVD) or plasma enhanced chemical vapor deposition (PECVD). The etch stop layer should be deposited to a thickness sufficient to function as an etch stop layer and so that the width by which the etch stop layer extends away from the sidewalls of the wiring line 44 provides the desired additional process margin to accommodate the formation of unlanded vias. To this end, the etch stop layer 48 is typically chosen to be less than one thousand Angstroms in thickness for processes using 0.35–0.5 $\mu$m design rules and might, for example, be deposited to a thickness of between about 200–1000 Å. Subsequently, a layer 50 of an intermetal dielectric, such as silicon oxide deposited in a CVD process from a TEOS source gas, is deposited over the wiring line 44 and etch stop layer 48.

Figure 5:
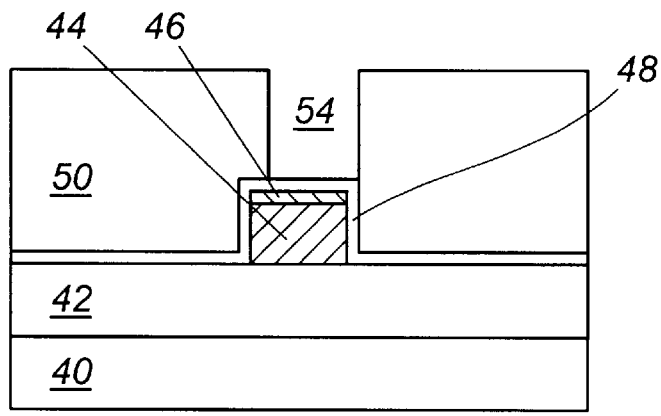

Next, a via is etched through the intermetal dielectric 50. Generally, a photoresist or hard mask (not shown) is provided on the surface of the intermetal dielectric 50 by conventional photolithographic methods. The mask exposes the surface of the intermetal dielectric in the region above where the via is to be formed. The via can be etched using different strategies in accordance with preferred embodiments of the present invention. In one alternative, the via can be etched all the way through using an etchant having a high level of selectivity between the intermetal dielectric material 50 and the etch stop layer 48. Such a high selectivity etching process can be selected in commercially available dielectric etchers such as the TEL-8500 or TEL DRN system and might, for example, derive an etchant in a plasma process from a mixture of source gases including $CF_4$ or $C_6F_8$ and $CO_2$ for the illustrated structure in which the intermetal dielectric 50 is an oxide and the etch stop layer 48 comprises silicon nitride or an oxynitride. In some instances, it may be undesirable to utilize such a high selectivity etching process through the entire thickness of the intermetal dielectric 50 because such high selectivity etching processes can be slow. Accordingly, in a particularly preferred aspect of the present invention, the via is etched through the intermetal dielectric in a two step process. In the first step, a high speed etching process forms a first via component 52 (FIG. 4) partially through the intermetal dielectric 50 Such a high speed etching process might be performed in the same TEL-8500 or TEL DRN system using an etchant derived from a $CF_4$ source gas. High speed etching processes tend not to be very selective and so the etching process used to define the first component of the via 52 is preferably stopped safely short of the etch stop layer. The rest of the etching process can be performed using a high selectivity (and likely slower) etching process such as that described above to complete definition of the via 54 shown in FIG. 5 which exposes the surface of the etch stop material 48 over the wiring line 44.

Figure 1:
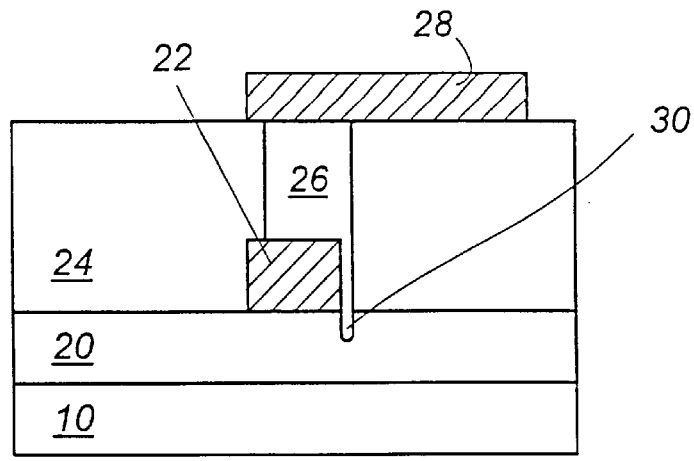
FIGS. 1–3 illustrate problems associated with unlanded vias when interconnect structures are formed in the conventional manner.
Figure 2:
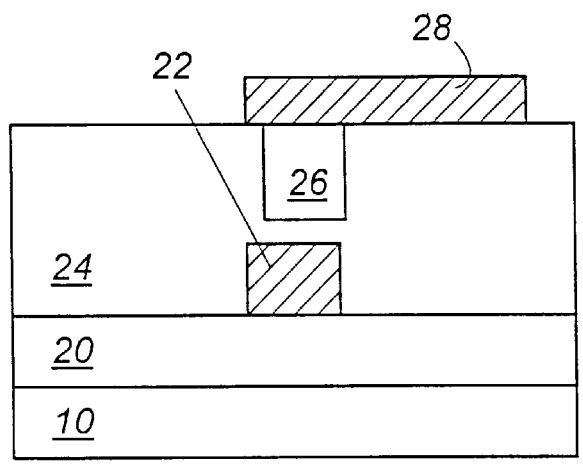
Figure 3:
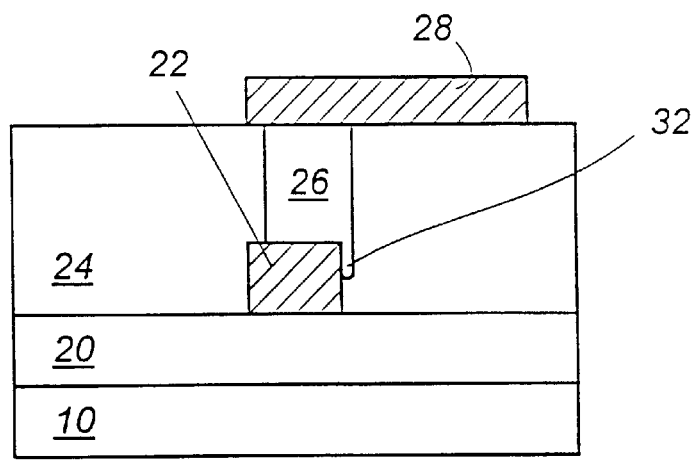

The via provided in this process will generally be situated over the combined width of the wiring line 44 and the portions of the etch stop layer 48 along the sidewalls of the wiring line 44. Definition of the unlanded portions of the via will not etch deeply along the sidewalls of the wiring lines because the etching process will be limited by the etch stop layer. Subsequent removal of the etch stop layer will not result in formation of deep notches because the etch for removing the etch stop layer will be much briefer, and hence more predictable and controllable, than the etch through the much thicker layer of intermetal dielectric 50. Thus, the wiring line structure provided in accordance with the present invention better avoids the unlanded via problem illustrated in FIG. 3.

Figure 6:
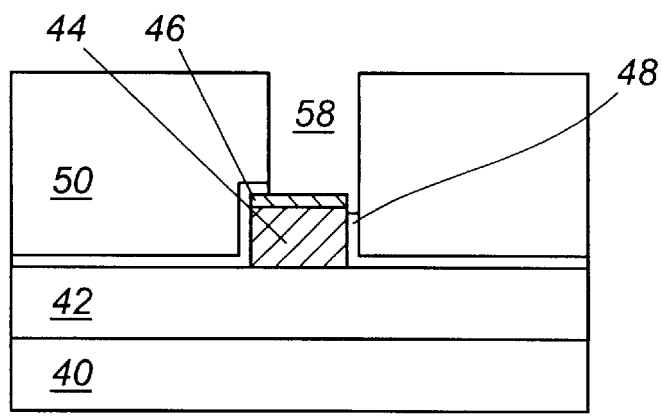
Figure 7:
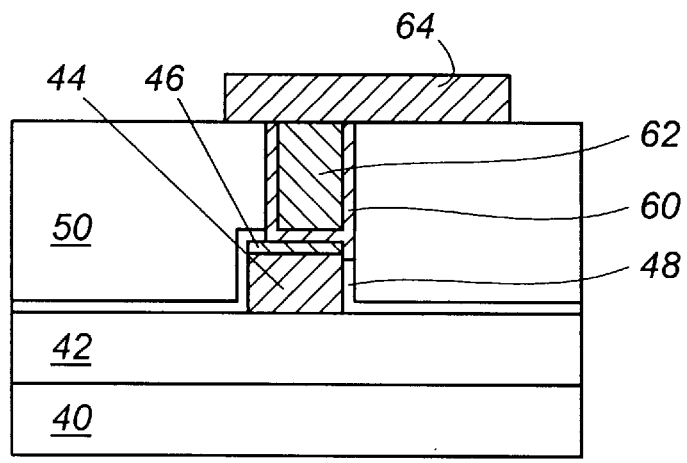

In particularly preferred embodiments of the invention, the etch stop layer is deposited over a plurality of wiring lines and is left in place in the final structure. As such, it is preferred that the etch stop layer be an insulating material such as the silicon nitride described above. For such preferred embodiments, the via formation process is completed by etching the etch stop layer 48 to expose a portion of the surface of the wiring line 44 within the via 58 (FIG. 6). An appropriate etchant for the preferred silicon nitride etch stop material could, for example, be derived from either a $CF_4$ or a $CHF_3$ source gas. This etch stop etching process might be performed in the same dielectric etching system as the previous via formation processes in a process that is essentially continuous with the earlier via etching processes and without changing the etching chamber. Preferably, the etchant used for removing the etch stop layer to complete definition of the via has a high level of selectivity whereby the silicon nitride is readily etched but the metal of the wiring line 44 or adhesion layer 46 is not etched or is only slowly etched.

The interconnect formation process continues by depositing a glue layer 60 to line the via to improve the adhesion of the via plug to the walls of the via. An appropriate glue layer 60 might consist of a thin layer of titanium nitride, titanium or a titanium tungsten mixture, and the glue layer might be deposited using a sputtering or CVD process to a thickness of 100–500 Å, depending on the dimensions of the particular via formed. The rest of the via is filled with a metal plug 62, which is preferably a tungsten plug formed by CVD from a $WF_6$ source gas. The surface of the tungsten plug 62 is typically defined in a metal etch back process or in a CMP process, which is typically more preferred. Processing continues to form at least a second level of wiring lines including a second level wiring line 64 in contact with the tungsten plug 62 and electrically connected to the first level wiring line 44. The second level wiring line might, for example, be aluminum deposited and patterned in the conventional manner.

Figure 8:
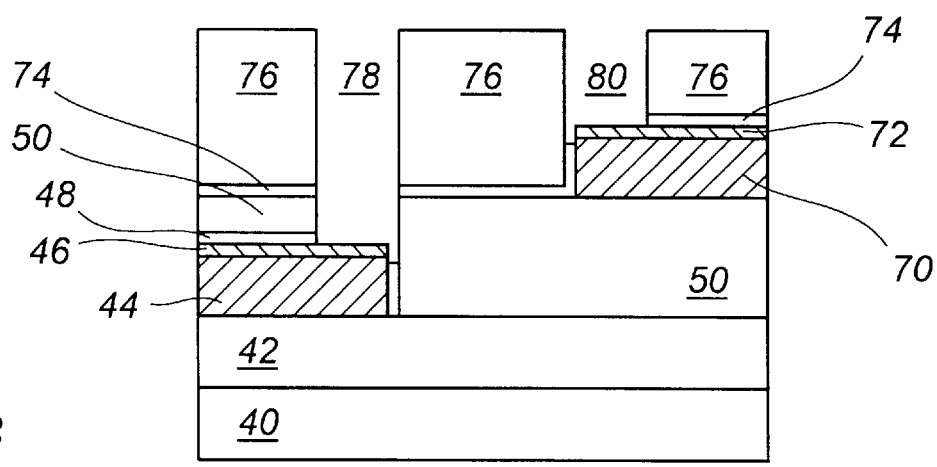
FIG. 8 illustrates a further aspect of a process for forming an interconnect structure according to the present invention.

A further advantage of the present method is illustrated in FIG. 8, which illustrates the simultaneous formation of vias to wiring lines formed on different levels. A first level wiring line including a layer of aluminum 44 covered by a layer of titanium nitride 46 is covered by a first level etch stop layer 48 and a first intermetal dielectric layer 50. A second level wiring line is formed on the layer 50 consisting of a lower layer of aluminum 70 covered by a layer of titanium nitride 72. The second level wiring line is covered by a second etch stop layer which, in the illustrated embodiment, is also selected to be silicon nitride. A second intermetal dielectric layer 76, which may also be silicon oxide, is provided over the surface of the second level wiring line and other parts of the device. Vias 78, 80 are formed to contact the first and the second level wiring lines at the same time. Most preferably, the via etch process continues for both vias 78, 80 through the second intermetal dielectric layer, stopping first on the second etch stop layer 74. The second etch stop layer 74 is then removed to expose the surface portion 72 of the second level wiring line and to expose the first intermetal dielectric layer 50. Etching continues within via 78 to reach the first etch stop layer 48 in a process that preferably does not appreciably etch the barrier layer 72. Because the via 80 is situated over either the second level wiring line or the second etch stop layer 74, the continuation of the etch process will not appreciably alter the via 80. Consequently, the multilevel interconnect structure of FIG. 8 can be formed with greater reliability and greater process latitude than is conventionally possible.

While the present invention has been described in terms of certain preferred embodiments, those of ordinary skill will appreciate that various modifications and alterations to the embodiments might be made without varying from the basic teachings of the present invention. Accordingly, the scope of the present invention is not to be limited to any of the particular embodiments described herein but is instead to be determined from the claims which follow.

What is claimed:

1. A method of forming an integrated circuit comprising:
providing a substrate covered by a layer of insulating material;
providing a first level wiring line over the layer of insulating material, the first level wiring line having an upper surface and sidewalls;
covering the upper surface and the sidewalls of the first level wiring line with an etch stop material;
providing a dielectric layer over the first level wiring line;
forming a first via through the dielectric layer to expose the etch stop material within the via, wherein the step of forming the first via includes a first etching process and a second etching process, wherein the first etching process has an etching rate higher than an etching rate of the second etching process;
removing the etch stop material to expose the first level wiring line;
providing a conductive plug within the first via; and
providing a second level wiring line in contact with the conductive plug.

2. The method of claim 1, wherein an etching selectivity of the second etching process between the dielectric layer and the etch stop layer is higher than an etching selectivity of the first etching process between the dielectric layer and the etch stop layer.

3. The method of claim 1, wherein the dielectric layer is an oxide and the etch stop layer is a nitride or oxynitride.

4. The method of claim 3, wherein the ratio of fluorine atoms to carbon atoms is higher in the first etching process than in the second etching process.

5. The method of claim 1, wherein the etch stop layer is less than approximately one thousand angstroms in thickness.

6. The method of claim 1, further comprising the steps of:
providing a third level wiring line above the first level wiring line and below the second level wiring line, the third level wiring line covered by a second etch stop material and a portion of the dielectric layer;
forming a second via through the dielectric layer in an etching process that stops on the second etch stop material;
removing the second etch stop material where it is exposed within the second via; and
providing a conductor within the second via.

7. The method of claim 6, wherein the step of forming the second via is performed concurrent with at least a part of the step of forming the first via.

8. A method of forming an integrated circuit comprising the steps of:
providing a substrate and depositing a layer of insulating material over the substrate;
providing a wiring line on a surface of the layer of insulating material, the wiring line having sidewalls and an upper surface;
depositing a layer of etch stop material over the wiring line and over the surface of the layer of insulating material;
depositing a layer of dielectric material over the layer of etch stop material, the dielectric material having a different composition than the etch stop material;
etching a via through the layer of dielectric material over the wiring line, with at least a latter portion of the etching step being performed with an etchant that etches the dielectric material at a sufficiently greater rate than the etchant etches the etch stop material for the etch stop material to function as a stop for the etching process; and
providing a conductor within the via.

9. The method of claim 8, wherein the step of forming the first via includes a first etching process and a second etching process, wherein the first etching process has an etching rate higher than an etching rate of the second etching process.

10. The method of claim 9, wherein an etching selectivity of the second etching process between the dielectric layer and the etch stop is higher than an etching selectivity of the first etching process between the dielectric layer and the etch stop layer.

11. The method of claim 10, wherein the ratio of fluorine atoms to carbon atoms is hither in the first etching process than in the second etching process.

12. The method of claim 8, wherein the dielectric layer is an oxide and the etch stop layer is a nitride or oxynitride.

13. The method of claim 8, wherein the etch stop layer is less than approximately one thousand angstroms in thickness.

* * * * *